(12) United States Patent
Shchekin et al.

(10) Patent No.: US 8,062,925 B2
(45) Date of Patent: Nov. 22, 2011

(54) PROCESS FOR PREPARING A SEMICONDUCTOR LIGHT-EMITTING DEVICE FOR MOUNTING

(75) Inventors: Oleg Borisovich Shchekin, San Francisco, CA (US); Xiaolin Sun, Pleasanton, CA (US); Decai Sun, Los Altos, CA (US)

(73) Assignees: Koninklijke Philips Electronics N.V., Eindhoven (NL); Philips Lumileds Lighting Company LLC, San Jose, CA (US)

( * ) Notice: Subject to any disclaimer, the term of this patent is extended or adjusted under 35 U.S.C. 154(b) by 511 days.

(21) Appl. No.: 11/383,522

(22) Filed: May 16, 2006

(65) Prior Publication Data

US 2007/0269925 A1 Nov. 22, 2007

(51) Int. Cl.
*H01L 21/00* (2006.01)
(52) U.S. Cl. ...... 438/106; 438/25; 438/26; 257/E21.527
(58) Field of Classification Search ............ 438/25–26, 438/106; 257/E21.527
See application file for complete search history.

(56) References Cited

U.S. PATENT DOCUMENTS

| | | | |
|---|---|---|---|
| 5,863,813 A | 1/1999 | Dando | |
| 6,455,878 B1 | 9/2002 | Bhat et al. | |
| 6,525,944 B1 | 2/2003 | Li | |
| 6,576,488 B2* | 6/2003 | Collins et al. | 438/29 |
| 6,630,689 B2 | 10/2003 | Bhat et al. | |
| 6,642,652 B2* | 11/2003 | Collins et al. | 313/512 |
| 6,686,581 B2 | 2/2004 | Verhoeckx et al. | |
| 6,744,077 B2 | 6/2004 | Trottier et al. | |
| 6,878,973 B2 | 4/2005 | Lowery et al. | |
| 6,891,197 B2 | 5/2005 | Bhat et al. | |
| 2003/0071568 A1 | 4/2003 | Lowery et al. | |
| 2003/0176017 A1* | 9/2003 | Sanaka et al. | 438/107 |
| 2004/0121512 A1 | 6/2004 | Manepalli et al. | |
| 2004/0203189 A1* | 10/2004 | Chen et al. | 438/108 |
| 2005/0006651 A1* | 1/2005 | LeBoeuf et al. | 257/79 |

FOREIGN PATENT DOCUMENTS

| | | |
|---|---|---|
| EP | 1255292 A1 | 11/2002 |
| WO | 2006041178 A2 | 4/2006 |

OTHER PUBLICATIONS

By William F. Nye, Inc.: NYE Lubeletter Autumn 1991, Retrieved From the Internet: URL:http://web.archive.org/web/20040722014253/http://www.nyeautomotive.com/lubeletters/1991Autumn.pdf, retrieved on Sep. 6, 2001, p. 3, col. 2, paragraph Creep-Of-Epdxy. pp. 1-4.

International Search Report and the Written Opinion of the International Searching Authority. PCT/IB2007/051715, Filed, May 8, 2007.

* cited by examiner

*Primary Examiner* — Matthew Smith
*Assistant Examiner* — Elias Ullah

(57) ABSTRACT

A process for preparing a semiconductor light-emitting device for mounting is disclosed. The light-emitting device has a mounting face for mounting to a sub-mount. The process involves treating at least one surface of the light-emitting device other than the mounting face to lower a surface energy of the at least one surface, such that when mounting the light-emitting device, an underfill material applied between the mounting face and the sub-mount is inhibited from contaminating the at least one surface.

21 Claims, 5 Drawing Sheets

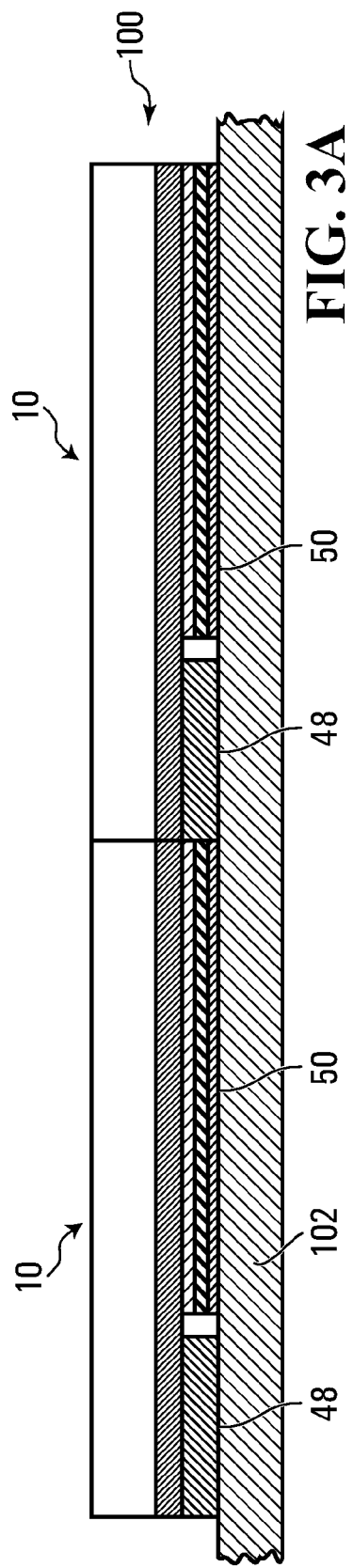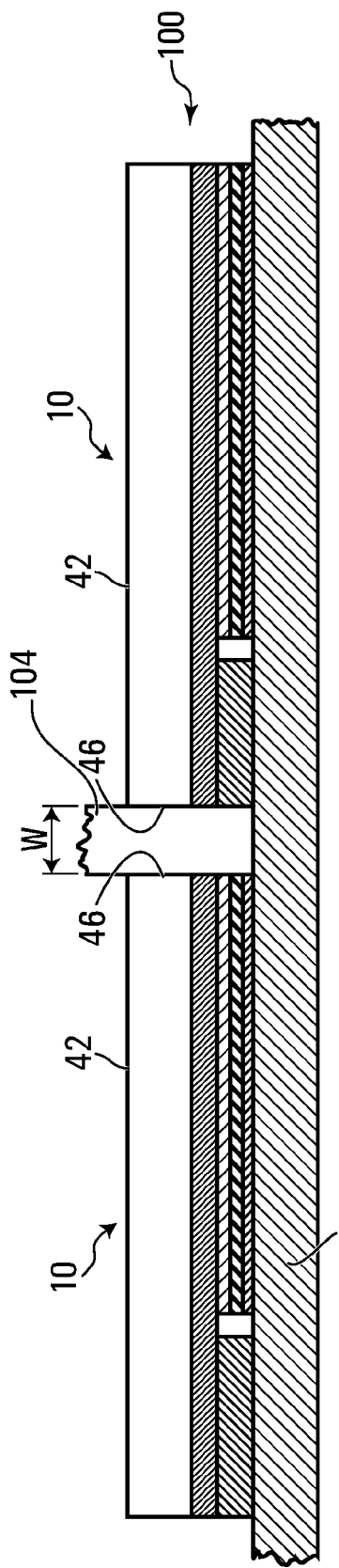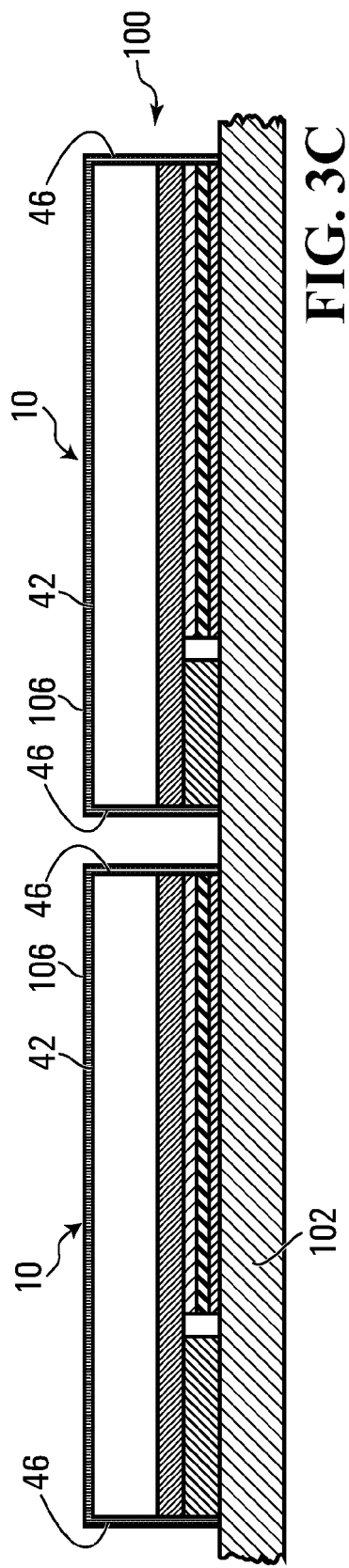

PROCESS FOR PREPARING A SEMICONDUCTOR LIGHT-EMITTING DEVICE FOR MOUNTING

BACKGROUND OF THE INVENTION

1. Field of Invention

This invention relates generally to semiconductor light-emitting devices, and more specifically to processing a semiconductor light-emitting device for mounting.

2. Description of Related Art

Semiconductor light-emitting devices such as light-emitting devices (LED's) provide efficient sources of light and are more robust than incandescent light bulbs and fluorescent tubes. Advancements in LED technology and processing have facilitated the use of such devices as replacements for traditional lighting sources in commercial and residential lighting applications, for example.

LED's may be encapsulated using various materials that may enhance the light output and/or protect the device. Such materials may improve electrical isolation between contacts, heat transfer to a sub-mount, mechanical mounting reliability, and/or improved coupling of light from the device.

There remains a need for improved processes for encapsulating light-emitting devices.

SUMMARY OF THE INVENTION

In accordance with one aspect of the invention there is provided a process for preparing a semiconductor light-emitting device for mounting. The light-emitting device has a mounting face for mounting to a sub-mount. The process involves treating at least one surface of the light-emitting device other than the mounting face to lower a surface energy of the at least one surface, such that when mounting the light-emitting device, an underfill material applied between the mounting face and the sub-mount is inhibited from contaminating the at least one surface.

Treating the at least one surface may involve treating at least one sidewall surface of the light-emitting device.

Treating the at least one surface may involve treating at least one light-emitting surface of the light-emitting device.

The light-emitting device may include a primary light-emitting surface and at least one secondary light-emitting surface, the secondary light-emitting surface operable to emit less light than the primary light-emitting surface and treating may involve treating the at least one secondary light-emitting surface.

Treating the at least one surface may involve treating sidewalls of a transparent substrate on which the light-emitting device is formed.

Treating may involve applying a treatment material to the at least one surface of the light-emitting device.

Applying the treatment material may involve applying a treatment material comprising organic molecules and an evaporable solvent.

Applying the treatment material may involve applying a treatment material including fluorocarbons in a fluoro-solvent.

Applying the treatment material may involve applying a treatment material including less than 15% fluorocarbons by weight.

Applying the treatment material may involve one of dipping the at least one surface in a liquid treatment material, spraying the treatment material onto the at least one surface, and generating a mist of a liquid treatment material proximate the at least one surface, the mist being operable to coat the at least one surface with the liquid treatment material.

Dipping may involve dipping the at least one surface in a liquid treatment material including constituents that selectively attach to the at least one surface.

The process may involve selectively treating the sub-mount to lower a surface energy of at least a portion of the sub-mount such that when mounting the light-emitting device the underfill material is inhibited from contaminating the portion of the sub-mount.

Selectively treating the sub-mount may involve selectively treating a sub-mount comprising one of a ceramic material and a silicon material.

Selectively treating the sub-mount may involve applying a treatment material to the sub-mount and exposing an area of the sub-mount to electromagnetic radiation to selectively change a characteristic of the treatment material on the area, the change causing one of the selectively exposed area of the sub-mount; and an unexposed area of the sub-mount to have lowered surface energy.

The mounting face may include at least one electrode surface and the process may involve bonding the at least one electrode surface to a corresponding conductive surface on the sub-mount such that the mounting face is spaced apart from the sub-mount.

The process may involve underfilling a gap between the spaced apart mounting surface and the sub-mount.

In accordance with another aspect of the invention there is provided a process for mounting a semiconductor light-emitting device on a sub-mount. The process involves adhesively mounting a wafer including a plurality of light-emitting devices on a medium, a mounting face associated with each of the light-emitting devices being in contact with the medium. The process further involves dicing the wafer into individual light-emitting devices, the individual light-emitting devices remaining in contact with the medium and having adjacent spaced apart exposed surfaces. The process also involves treating exposed surfaces of the individual light-emitting devices to lower a surface energy of the exposed faces and removing the light-emitting device from the medium. The process further involves bonding the mounting face of the light-emitting device to the sub-mount and underfilling a gap between the mounting face and the sub-mount with an underfill material, the underfill material being inhibited from contaminating the treated exposed faces of the light-emitting face.

The process may further involve stretching the medium before treating to cause a spacing between the individual light-emitting devices to be expanded to further facilitate treating.

Dicing the wafer may involve dicing the wafer using a dicing blade, the dicing blade having a width sufficient to cause the exposed surfaces be sufficiently spaced apart after dicing to facilitate treating of the exposed surfaces.

The mounting face may include at least one electrode surface and bonding may involve introducing a conductive bonding material between the electrode surface and a corresponding conductive surface on the sub-mount and heating the light-emitting device and the sub-mount to cause the conductive bonding material to bond the at least one electrode surface to the corresponding conductive surface on the sub-mount.

The process may further involve removing the treatment material from the light-emitting device after underfilling.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention,

FIG. 3A-3E are a series of schematic cross-sectional views illustrating processing of a light-emitting device in accordance with the process shown in FIG. 2.

DETAILED DESCRIPTION

Figure 1:
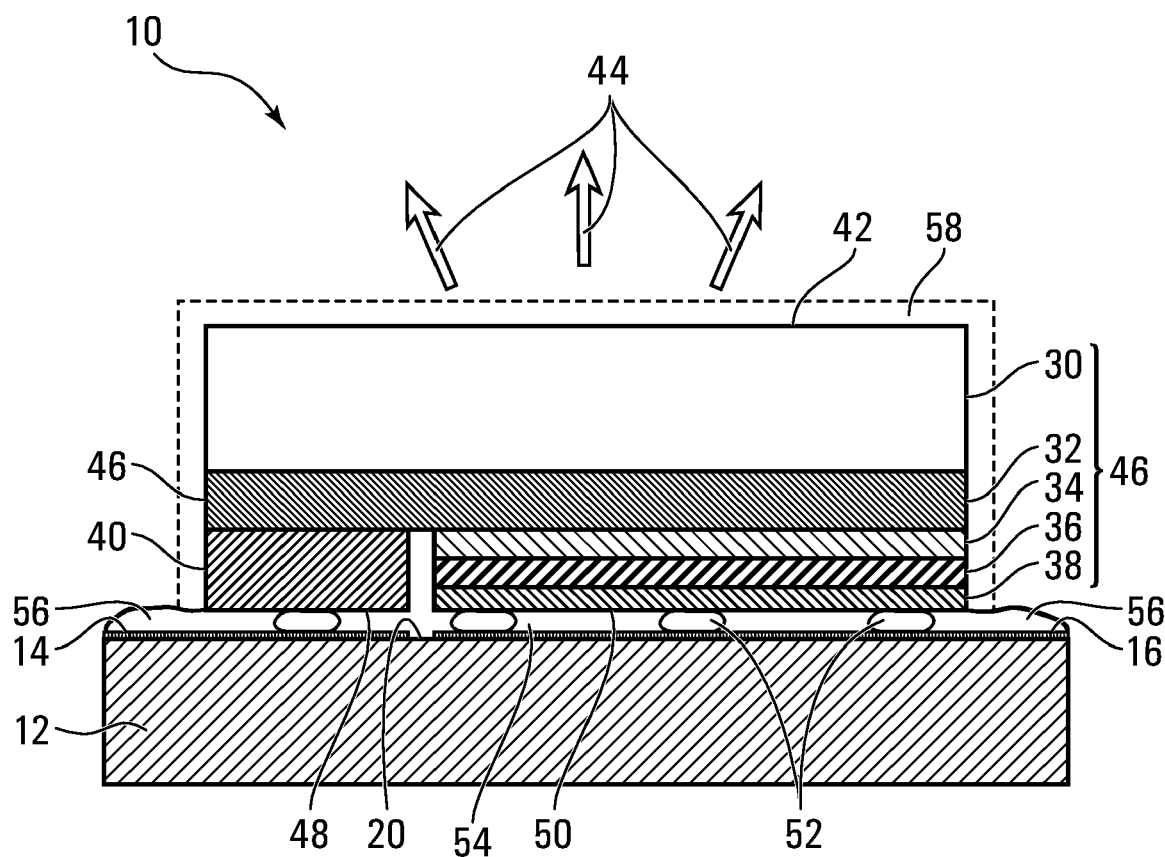
FIG. 1 is a schematic cross-sectional view of a light-emitting device processed in accordance with a first embodiment of the invention.

Referring to FIG. 1, a semiconductor light-emitting device prepared for mounting by a process in accordance with a first embodiment of the invention is shown generally at 10. The light-emitting device 10 is mounted on a sub-mount 12.

In one embodiment the light-emitting device 10 includes a substrate layer 30, on which an n-type conductivity semiconductor material layer 32 is epitaxially grown. The light-emitting device 10 further includes an epitaxially grown active layer 34 on the n-type layer 32, and an epitaxially grown p-type conductivity semiconductor material layer 36 on the active layer 34.

The light-emitting device 10 further includes a reflective p-electrode layer 38 formed on an outer surface of the p-type layer 36, and an n-electrode layer 40 formed on the n-type layer 32. The electrodes 38 and 40 may be formed using a reflective metallic material, and facilitate connection of the light-emitting device 10 to the sub-mount 12 in order to supply an electrical current to the device. The p-electrode 38 includes a mounting face 50, and the n-electrode 40 includes a mounting face 48. The mounting faces 48 and 50 facilitate later mounting of the device.

When a forward bias voltage is applied to the light-emitting device (i.e. the p-electrode 38 is made more positive than the n-electrode 40) a forward bias current flows through the p-type layer 36, the active layer 34, and the n-type layer 32, and photons are generated in the active layer. The photons generated in the active layer 34 are incident in all directions, and photons incident on the reflective p-electrode 38 are reflected back through the p-type layer 36, the active layer 34, and the n-type layer 32, through the substrate layer 30, and are emitted as light from a primary light-emitting surface 42. Other photons from the active layer 34 that are directly incident on the n-type layer 32 pass through the n-type layer, through the substrate layer 30, and are emitted as light from the primary light-emitting surface 42. In general, a significant portion of light generated in the active layer 34 will be emitted through the primary light-emitting surface 42 in the direction shown by the arrows 44. However, a less significant portion of the light may be emitted through other surfaces, such as sidewall surfaces 46.

In one embodiment the sub-mount 12 comprises an electrically insulating material, such as a ceramic material, and the sub-mount includes a first electrical contact area 14, and a second electrical contact area 16, each formed on an outer surface of the sub-mount and separated by an insulating gap 20. The first and second electrical contact areas 14 and 16 may be formed by depositing a metallic material, such as gold, on the sub-mount 12 and facilitate electrical connection to the sub-mount 12.

In embodiments where the light-emitting device 10 is to be mounted using flip-chip mounting technology, the mounting faces 48 and 50 are generally co-planar. Flip-chip mounting refers to a mounting technique wherein the light-emitting device 10 is fabricated on a substrate (such as the substrate layer 30) and then the device is flipped over and the mounting faces 48 and 50 are bonded to the sub-mount 12, using electrically conductive material beads 52 (e.g. a metal such as gold). The bonding involves heating the device to soften the conductive material beads 52, which causes the beads to bond the mounting faces 48 and 50 to the electrical contact areas 14 and 16. In some embodiments, a thermosonic process is used, i.e. the devices are subjected to ultrasonic vibrations while being heated, thus causing an improved bond between the conductive material beads, the mounting faces 48 and 50, and the electrical contact area 14 and 16 of the sub-mount 12. The bonding process also provides electrical connection between the electrical contact areas 14 and 16 and the n-electrode 40 and p-electrode 38 respectively.

It is common practice when mounting semiconductor devices such as the light-emitting device 10, to underfill a gap 54, between the mounting faces 48 and 50 and the sub-mount 12, using an underfill material 56. The underfill material 56 may be a material, such as an epoxy, which has weak internal or cohesive bonds, and thus has a strong tendency to wet other surfaces, particularly surfaces having a high surface energy. The mounting faces 48 and 50, and the sidewall surfaces 46 of the light-emitting diode generally have a high surface energy in comparison with the underfill material, which causes the underfill to wick into the gap 54, aided by capillary attraction forces. The underfill material is then allowed to cure, thus providing enhanced mechanical and structural integrity for the device. The underfill material may include additives that enhance thermal conduction between the light-emitting device 10 and the sub-mount 12, or cause the cured underfill to have a certain refractive index. The underfill material may also include additives that provide a better match between a thermal expansion coefficient of the underfill material 56 and the electrical contact areas 14 and 16 and the n-electrode 40 and p-electrode 38 respectively, thus minimizing mechanical stresses during operation.

Unfortunately the tendency of the underfill material 56 to wet the surfaces 46 may also tend to wick up the sidewall surfaces 46 of the light-emitting device 10, thus contaminating these surfaces. The contamination may have an impact on further processes related to packaging the light-emitting device 10. For example, packaging the light-emitting diode may optionally involve encapsulating the light-emitting device 10 in an encapsulation material 58. Encapsulation materials are used to protect the light-emitting device, provide refractive index matching, and/or to prevent ingress of contaminants into the semiconductor material layers.

The presence of underfill material 56 on the sidewalls 46 of the light-emitting device 10 may however cause poor adhesion of the encapsulating material 58 due to incompatibility with the underfill material. Furthermore, contamination of the surface 46 by the underfill material 56 may also cause stress concentrations along the sidewalls of the light-emitting device 10, which may cause potential failure during operation of the mounted light-emitting device 10. Encapsulation material 58 may be specifically selected for resistance to degradation under radiation by light emitted by the light-emitting device 10. However, commonly used underfill materials may not be as resistant to decomposition by light and may degrade causing premature failure of the device.

Generally, in accordance with one aspect of the invention, a process for preparing the semiconductor light-emitting device 10 for mounting to the sub-mount 12, involves treating at least one surface of the light-emitting device 10, other than the mounting faces 48 or 50, to lower a surface energy of the at least one surface. When mounting the light-emitting device 10, the underfill material 56 applied between the mounting faces 48 and 50 and the sub-mount 12, is inhibited from contaminating the at least one surface due to the lowered surface energy of the at least one surface.

In the embodiment shown in FIG. 1, at least a portion of the surfaces 46 proximate the mounting faces 48 and 50 are treated to lower the surface energy of these surfaces. The underfill material 56 will be inhibited from wetting the surfaces 46 due to the lowered surface energy, and thus the underfill material 56 will tend to follow along the higher surface energy sub-mount surface, rather than wick up the sidewalls of the light-emitting device 10. While it is unlikely that the underfill material 56 will be able to wick up onto the surface 42, and thus this surface may not require such treatment, in some embodiments the treating process may be more conveniently practiced if both surfaces 46 and surface 42 are simultaneously treated.

Process

The treatment process for lowering the surface energy of the surfaces 46 is described in more detail with reference to FIGS. 2 and 3. Referring to FIG. 3A, in general, a plurality of light-emitting devices 10 are simultaneously fabricated on a semiconductor wafer 100 (wafer 100 shows two light-emitting devices 10, but in practice a wafer will generally include a plurality of devices 10).

Figure 2:
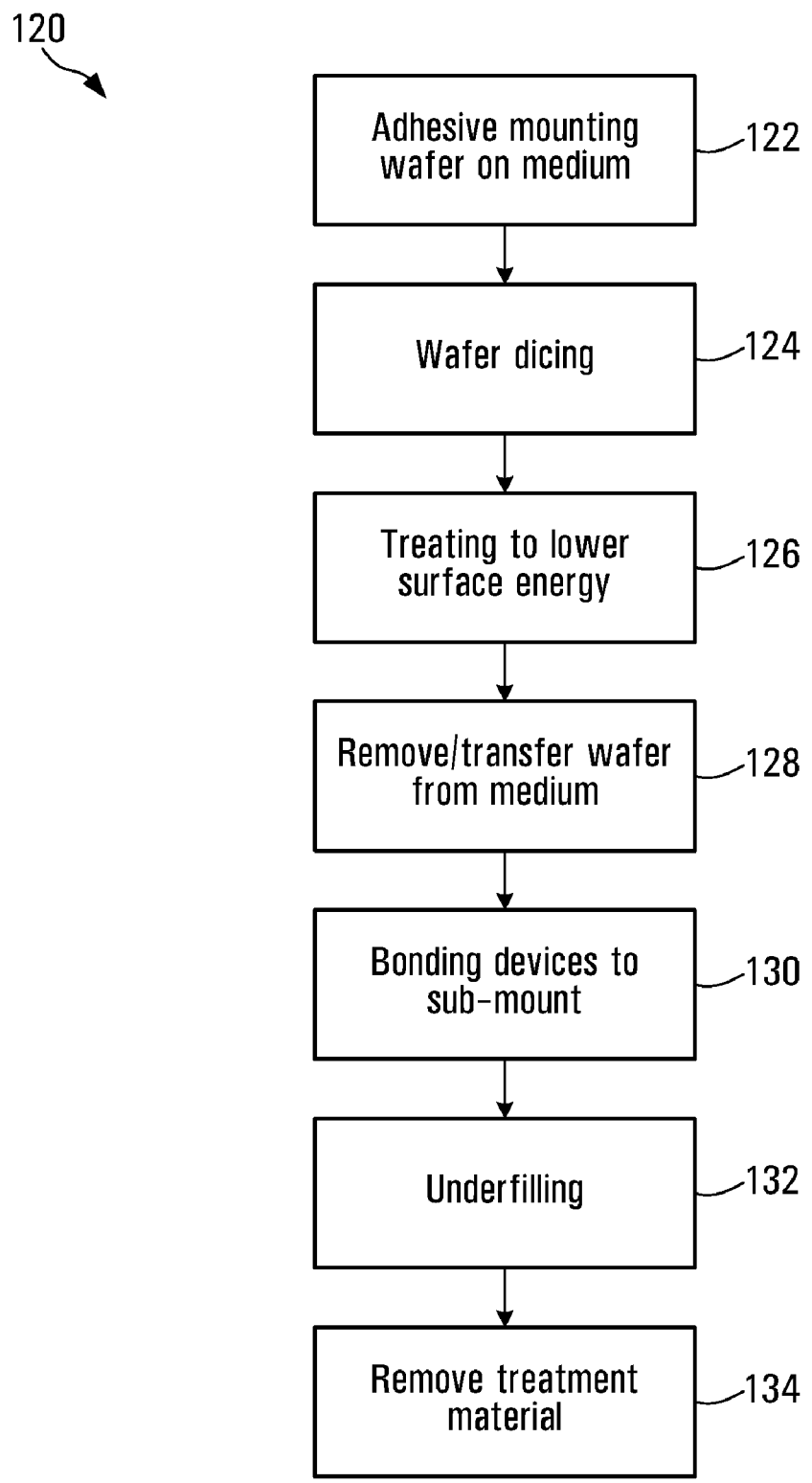
FIG. 2 is a process flowchart illustrating the processing of the light-emitting device shown in FIG. 1.

Referring to FIG. 2 and 3A, the process for treating the plurality of semiconductor devices 10 on the semiconductor wafer 100 is shown generally at 120. As shown at 122, the process begins with adhesively mounting the wafer 100 on a medium 102. In one embodiment, the medium 102 is a semiconductor processing tape, such as polyvinyl chloride (PVC) adhesive tape. The wafer 100 is mounted such that the mounting faces 48 and 50 are in contact with the medium and adhesively adhered thereto.

The process 120 continues at 124 with dicing of the wafer 100 into individual light-emitting devices 10 as shown in FIG. 3B. During dicing, the individual light-emitting devices 10 remain in contact with the medium 102 and the dicing is performed such that the individual devices 10 are completely separated from each other by a kerf width w of a dicing blade 104, used to dice the wafer. However the dicing depth is carefully controlled such that the medium 102 is not cut through by the blade 104. Accordingly, after dicing, the plurality of individual devices 10, remain on the substantially intact medium 102. At this stage, the diced wafer 100 may be visually inspected for defects. The dicing causes sidewall surfaces 46 of the light-emitting devices 10 to be exposed.

As shown at 126, the process 120 continues with the treating of the surfaces 42 and 46 to lower the surface energy of the surfaces 46. In this embodiment, treating involves non-selectively treating all exposed surfaces of the light-emitting devices 10, including both the sidewall surfaces 46 and the primary light-emitting surfaces 42, with a liquid treatment material containing an organic molecule, such as a fluorocarbon dissolved in a solvent such as fluoro-solvent. In one embodiment the treatment material includes up to 15% fluorocarbon polymer by weight in a fluoro-solvent. One example of such a treatment material is NyeBar®, which is supplied by the Nye Company of Fairhaven, Mass. NyeBar® comprises a 0.1% to 2% concentration of a fluorocarbon polymer in a fluoro-solvent.

The mounting faces 48 and 50 are protected from the treating by the medium 102. In one embodiment, prior to treating the surfaces 42 and 46 of the light-emitting device 10, the medium 102 is stretched to cause spaces between individual light-emitting devices 10 to be expanded to improve the exposure of the surfaces 46, thus facilitating the treating. The stretching of the medium may be performed using a jig that provides a controlled amount of stretching of the medium in two orthogonal directions.

Referring to FIG. 3C, the surfaces 42 and 46 are treated by dipping the wafer 100 in a liquid treatment material, such as NyeBar, thus forming a film on the surfaces. The fluoro-solvent is then allowed to evaporate leaving fluorocarbon polymer treatment material film 106 on the surfaces 42 and 46. The treatment material film 106 lowers the surface energy of the surfaces 42 and 46, thus inhibiting wetting of these surfaces in a subsequent underfilling process. Alternatively, in other embodiments, a liquid-based treatment material may be misted or sprayed onto the surfaces to be treated.

In another embodiment of the invention, the treatment material may comprise organic molecules having functional groups which selectively attach to certain surfaces and not to others. For example, a treatment material may be selected such that it has good adhesion to the electrode layer 38, which is commonly a metallic layer, while having poor or significantly no adhesion to the layers 30 to 36. In one embodiment the treatment material is an alkane thiol, which selectively attaches to gold, gold being one of the preferred materials for the electrodes 38 and 40. Accordingly, dipping the wafer 100 in an alkane thiol treatment material selectively coats only a sidewall surfaces of the electrodes 38 and 40, when the electrodes comprise gold. Since the mounting faces 48 and 50 are protected from exposure to the treatment material by the medium 102, these surfaces are not affected by the treatment. In a subsequent underfill process, the lowered surface energy of the sidewalls of the electrodes 38 and 40 presents a barrier to the underfill material 56 wicking up the sidewalls 46.

Figure 3D:
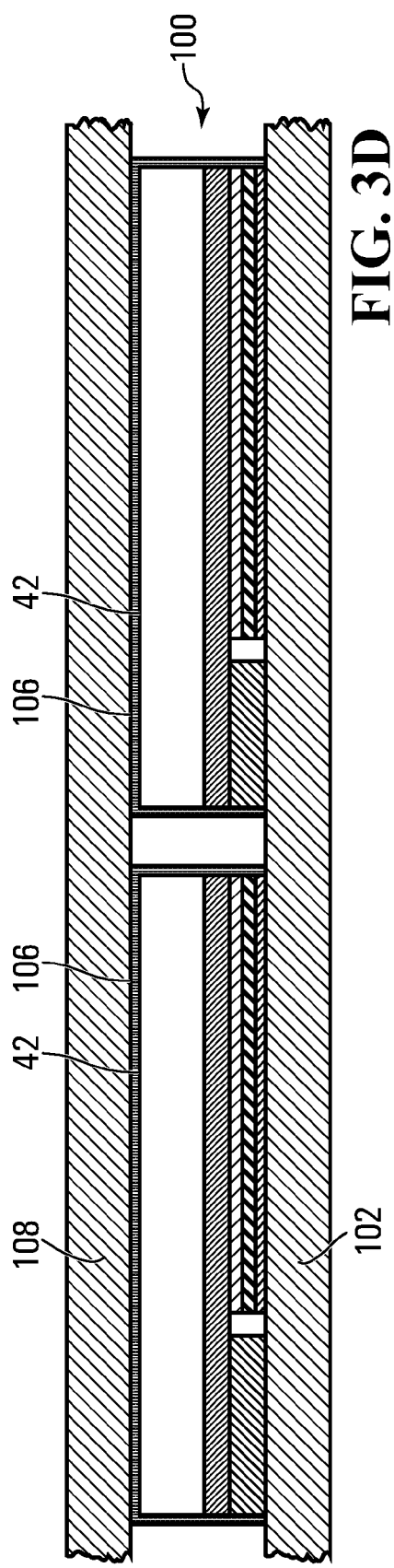
Figure 3E:
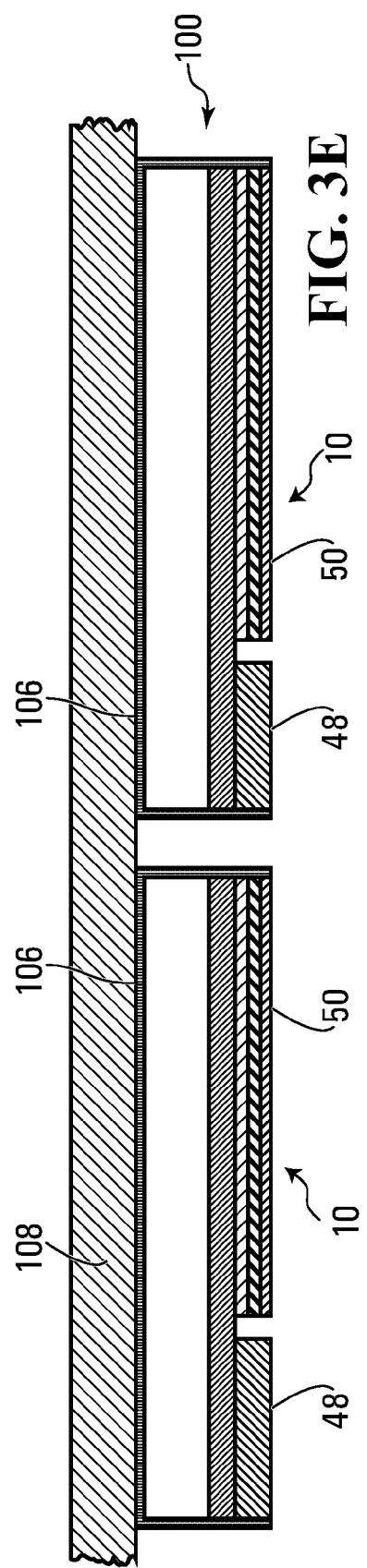

Returning to FIG. 2, as shown at 128, after treating, the light-emitting devices 10 may be removed from the medium or may be transferred from the medium to a second medium. Referring to FIG. 3D, the transfer may involve adhesively mounting a second medium 108 to the treatment material film 106 on the primary light-emitting surfaces 42 of the light-emitting devices 10. Referring to FIG. 3E, the medium 102 may then be removed from the mounting faces 48 and 50, leaving the plurality of light-emitting devices 10 attached to the second medium 108. Transferring the light-emitting devices 10 to a second medium 108 allows access to the mounting faces 48 and 50 for further bonding of the light-emitting device to the sub-mount 12.

As shown at 130, the process 120 continues with bonding of the light-emitting devices 10 to respective sub-mounts 12. In this embodiment, the light-emitting devices 10 are configured for flip-chip mounting as described earlier. The flip-chip mounting process commonly leaves the gap 54 between the mounting faces 48 and 50 and the sub-mount 12, as shown in FIG. 1.

As shown at 132, the process 120 then continues with underfilling of the gap 54 (shown in FIG. 1) with the underfill material 56. The underfill material 56 is generally an organic resin polymer, which is dispensed between the mounting faces 48 and 50 and the sub-mount 12 and wicks into the gap 54 under forces of capillary attraction. As shown in FIG. 1, due to the treatment of the surface 46, the underfill material 56 is prevented from wicking up the sides of the light-emitting device 10, and the underfill material primarily adheres to the mounting faces 48 and 50 and upper surface of the sub-mount 12.

As shown at 134, after underfilling, the treatment material film 106 may be optionally removed from the surfaces 42 and 46 to facilitate further processing of the mounted light-emitting devices 10. Removing the treatment material may be important where it is desired to encapsulate the light-emitting device 10 using an index-matching or other material to protect the device. In one embodiment, the second medium 108 comprises an adhesive that operates to remove most or all of the treatment material from the surface 42, when the individual light-emitting devices 10 are removed from the second medium. In other embodiments, removal involves further treatment steps, such as dipping or washing the light-emitting device 10 in a solvent to dissolve and remove the treatment material from the surfaces 42 and 46.

Process for Treating the Sub-Mount

In one embodiment of the invention, the sub-mount 12 shown in FIG. 1 may be selectively treated to lower a surface energy of at least a portion of the sub-mount. When mounting the light-emitting device 10 on the sub-mount 12, an underfill material applied between the light-emitting device and the sub-mount will be inhibited from contaminating the treated portion of the sub-mount.

Figure 4A:
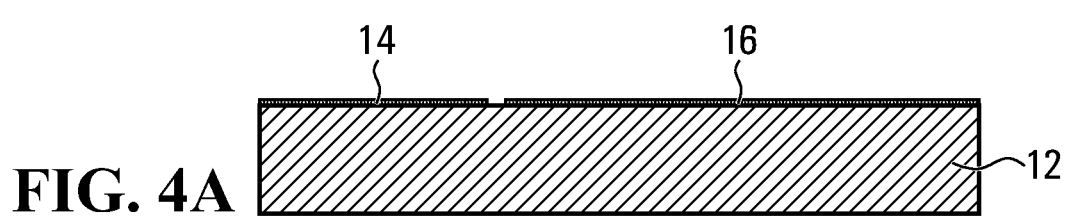
FIG. 4A-4E are a series of schematic cross-sectional views illustrating processing of a substrate for mounting a light-emitting device in accordance with another embodiment of the invention.
Figure 4B:
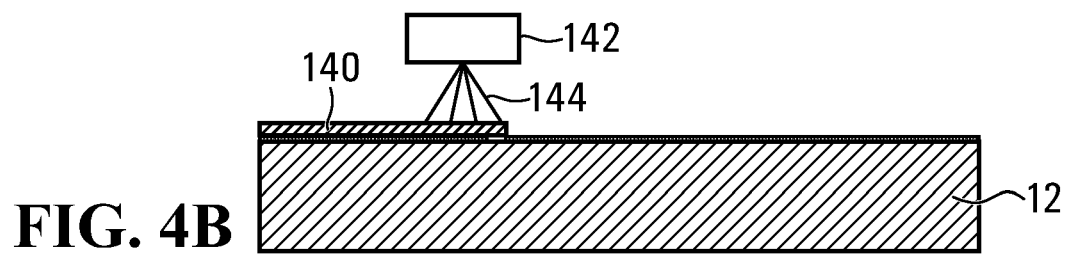

A process for treating the sub-mount 12 is described with reference to FIGS. 4A to 4E. Referring to FIG. 4A, a sub-mount 12 is shown including the first and second electrical contact areas 14 and 16. Referring to FIG. 4B, the process begins by applying a treatment material 140 over the first and second electrical contact areas 14 and 16 of the sub-mount 12. In the embodiment shown, the treatment material 140 is applied in liquid form using a spray device 142, which generates a spray 144 for coating the sub-mount 12. The spray device 142 is operable to be translated over the surface of the sub-mount 12, thereby covering the sub-mount 12 with the treatment material 140.

Figure 4C:
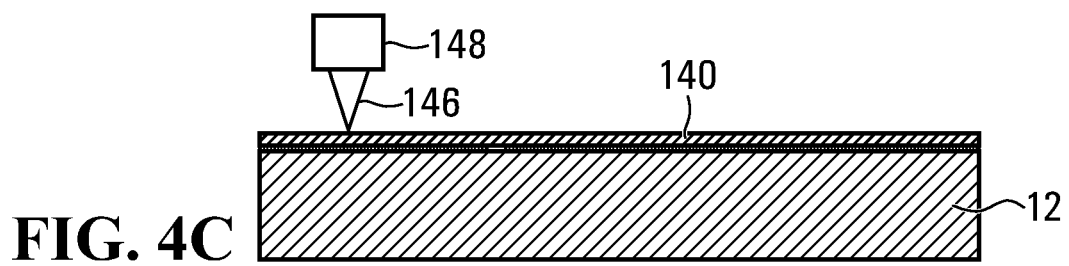

Referring to FIG. 4C, once the treatment material has dried in place on the sub-mount 12, portions of the sub-mount are exposed to an ultraviolet (UV) radiation beam 146, produced by a radiation source 148. The radiation source 148 may be a UV laser, or other UV source, and in this embodiment, the radiation source includes a modulator (not shown), which selectively activates the UV beam 146, while translating the radiation source to cause portions of the treatment material 140 to be ablated or otherwise de-bonded from the surface of the sub-mount 12 in accordance with a desired pattern.

Figure 4D:
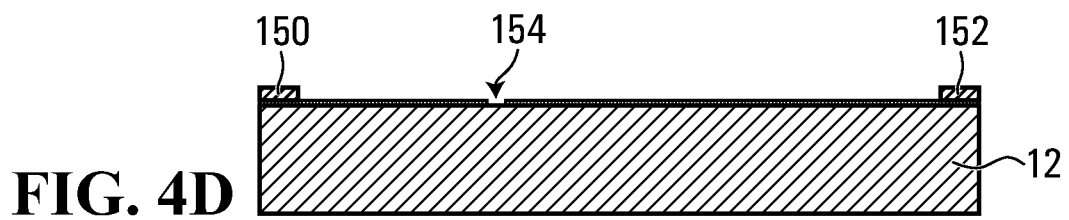

FIG. 4D shows the sub-mount 12 after portions of the treatment material 140 have been ablated. In this case, the treatment material portions 150 and 152 remain on an outer periphery of the sub-mount 12, while treatment material in the area 154 has been removed by the ablation.

Figure 4E:
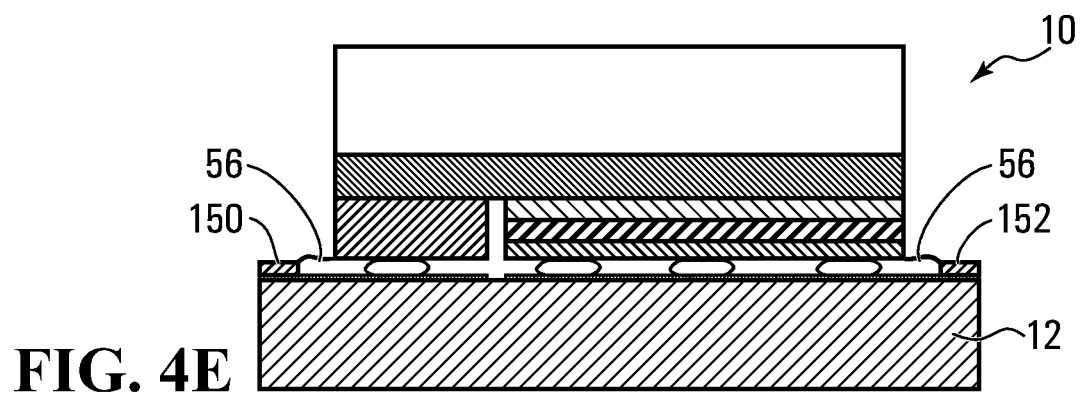

Referring to FIG. 4E, after mounting the light-emitting device 10 on the sub-mount 12, in accordance with the process described above in relation to FIGS. 2 and 3, the underfill material 56 is applied between the light-emitting device 10 and the sub-mount 12. The treatment material portions 150 and 152 prevent the treatment material from flowing past the edges of the sub-mount 12. Once the underfill material 56 has been applied, the treatment material portions 150 and 152 may be removed by dissolving them in an applied solvent, as described above.

The sub-mount 12 may include a ceramic substrate or a silicone substrate and when treated in accordance with process described above, prevents the underfill material 56 from flowing over the sides of the sub-mount 12 and contaminating the surfaces.

In other embodiments a treatment material may be used that is sensitive to radiation at wavelengths other than UV wavelengths and other radiation sources may be used to perform the exposure. Other embodiments may employ patterning techniques such as applying a film mask over the treatment material and subjecting the sub-mount 12 to area radiation at UV or other wavelengths, thereby selectively changing a characteristic of the treatment material on a portion of the sub-mount 12 to cause the surface energy of portions of the sub-mount to be lowered.

While specific embodiments of the invention have been described and illustrated, such embodiments should be considered illustrative of the invention only and not as limiting the invention as construed in accordance with the accompanying claims.

What is claimed is:

1. A process for preparing a semiconductor light-emitting device for mounting, the light-emitting device having a mounting face for mounting to a sub-mount, the mounting face comprising a bottom surface of a metal electrode, the process comprising:
    treating at least one surface of the light-emitting device other than the mounting face to lower a surface energy of said at least one surface, such that when mounting the light-emitting device, an underfill material applied between the mounting face and the sub-mount is inhibited from contaminating said at least one surface, wherein said at least one surface comprises a sidewall of said metal electrode.

2. The process of claim 1 wherein treating said at least one surface comprises treating at least one sidewall surface of the light-emitting device.

3. The process of claim 2 wherein treating said at least one surface comprises treating sidewalls of a transparent substrate on which the light-emitting device is formed.

4. The process of claim 1 wherein treating said at least one surface comprises treating at least one light-emitting surface of the light-emitting device.

5. The process of claim 4 wherein the light-emitting device comprises a primary light-emitting surface and at least one secondary light-emitting surface, said secondary light-emitting surface operable to emit less light than said primary light-emitting surface and wherein said treating comprises treating said at least one secondary light-emitting surface.

6. The process of claim 1 wherein said treating comprises applying a treatment material to said at least one surface of the light-emitting device.

7. The process of claim 6 wherein applying said treatment material comprises applying a treatment material comprising organic molecules and an evaporable solvent.

8. The process of claim 7 wherein applying said treatment material comprises applying a treatment material comprising fluorocarbons in a fluoro-solvent.

9. The process of claim 8 wherein applying said treatment material comprises applying a treatment material comprising less than 15% fluorocarbons by weight.

10. The process of claim 6 wherein applying said treatment material comprises one of:
    dipping said at least one surface in a liquid treatment material;
    spraying said treatment material onto said at least one surface; and generating a mist of a liquid treatment material proximate said at least one surface, said mist being operable to coat said at least one surface with said liquid treatment material.

11. The process of claim 1 wherein treating comprises dipping said at least one surface in a liquid treatment material comprising constituents that selectively attach to said metal electrode and have poor or significantly no adhesion to at least one semiconductor layer in the semiconductor light-emitting device.

12. The process of claim 1 further comprising selectively treating the sub-mount to lower a surface energy of at least a portion of the sub-mount such that when mounting the light-emitting device the underfill material is inhibited from contaminating said portion of the sub-mount.

13. The process of claim 12 wherein selectively treating the sub-mount comprises selectively treating a sub-mount comprising one of a ceramic material and a silicon material.

14. The process of claim 12 wherein selectively treating the sub-mount comprises:
applying a treatment material to the sub-mount;
exposing an area of the sub-mount to electromagnetic radiation to selectively change a characteristic of said treatment material on said area, said change causing one of:
said selectively exposed area of the sub-mount; and
an unexposed area of the sub-mount;
to have lowered surface energy.

15. The process of claim 1 further comprising bonding said bottom electrode surface to a corresponding conductive surface on the sub-mount such that the mounting face is spaced apart from the sub-mount.

16. The process of claim 15 further comprising underfilling a gap between said spaced apart mounting surface and the sub-mount.

17. The process of claim 1 wherein said treating at least one surface occurs prior to applying an underfill.

18. A process for mounting a semiconductor light-emitting device on a sub-mount, the process comprising:
adhesively mounting a wafer including a plurality of light-emitting devices on a medium, a mounting face associated with each of the light-emitting devices being in contact with said medium, said mounting face comprising a bottom surface of a metal electrode;
dicing the wafer into individual light-emitting devices, said individual light-emitting devices remaining in contact with said medium and having adjacent spaced apart exposed surfaces;
treating said exposed surfaces of said individual light-emitting devices to lower a surface energy of said exposed surfaces, said exposed surfaces including a sidewall of said metal electrode;
removing the light-emitting device from said medium;
bonding the mounting face of the light-emitting device to the sub-mount;
underfilling a gap between the mounting face and the sub-mount with an underfill material, said underfill material being inhibited from contaminating said treated exposed surfaces of the light-emitting device.

19. The process of claim 18 further comprising stretching said medium before said treating to cause a spacing between said individual light-emitting devices to be expanded to further facilitate said treating.

20. The process of claim 18 wherein dicing the wafer comprises dicing the wafer using a dicing blade, said dicing blade having a width sufficient to cause said exposed surfaces be sufficiently spaced apart after said dicing to facilitate said treating of said exposed surfaces.

21. The process of claim 18 further comprising removing said treatment material from the light-emitting device after said underfilling.

* * * * *